United States Patent
Sanyal et al.

(10) Patent No.: US 12,326,466 B2
(45) Date of Patent: Jun. 10, 2025

(54) IDENTIFYING GLITCHES AND LEVELS IN MIXED-SIGNAL WAVEFORMS

(71) Applicants: Indian Institute of Technology Kharagpur, Kharagpur (IN); TEXAS INSTRUMENTS INCORPORATED, Dallas, TX (US)

(72) Inventors: Sayandeep Sanyal, Kharagpur (IN); Pallab Dasgupta, Kharagpur (IN); Aritra Hazra, Kharagpur (IN); Scott Morrison, Dallas, TX (US); Sudhakar Surendran, Bangalore (IN); Lakshmanan Balasubramanian, Bangalore (IN)

(73) Assignees: Indian Institute of Technology Kharagpur, Kharagpur (IN); TEXAS INSTRUMENTS INCORPORATED, Dallas, TX (US)

( * ) Notice: Subject to any disclaimer, the term of this patent is extended or adjusted under 35 U.S.C. 154(b) by 24 days.

(21) Appl. No.: 18/071,917

(22) Filed: Nov. 30, 2022

(65) Prior Publication Data
US 2023/0176100 A1    Jun. 8, 2023

Related U.S. Application Data

(60) Provisional application No. 63/285,652, filed on Dec. 3, 2021.

(51) Int. Cl.
*G01R 23/16* (2006.01)

(52) U.S. Cl.
CPC ............................. *G01R 23/16* (2013.01)

(58) Field of Classification Search
CPC ....... G01R 23/16; G01R 29/00; G01R 29/027
See application file for complete search history.

(56) References Cited

U.S. PATENT DOCUMENTS

| 7,085,979 B2 | 8/2006 | Kim et al. | |
| 2003/0226082 A1* | 12/2003 | Kim | G06K 19/073 714/734 |
| 2017/0032125 A1* | 2/2017 | Lee | G08B 21/18 |
| 2020/0209309 A1* | 7/2020 | Martin | G06F 21/72 |

OTHER PUBLICATIONS

Arunajadai, S.G. et al., "Step detection in single-molecule real time trajectories embedded in correlated noise," PLoS One, vol. 8, No. 3, e59279, Mar. 2013, 9 pages.

(Continued)

*Primary Examiner* — Alvaro E Fortich
(74) *Attorney, Agent, or Firm* — Withrow & Terranova, PLLC (57) ABSTRACT

Various embodiments disclosed herein provide for a glitch detection and level detection method that use information contained in the signal itself to determine at which resolution or granularity the glitch detection and level detection operates. In particular, the glitch detection method comprises defining a glitch in terms of a change in the area under the waveform which can serve to disambiguate glitches from noises and other transient side effects of level transmissions. Likewise, the level detection method uses an entropy-based metric to identify levels that are significant in context of the entire signal and not in absolute terms.

22 Claims, 9 Drawing Sheets

(56) References Cited

OTHER PUBLICATIONS

Carter, B.C. et al., "A Comparison of Step-Detection Methods: How Well Can You Do?," Biophysical Journal, vol. 94, Issue 1, Jan. 2008, pp. 306-319.
Drugman, T. et al., "Detection of Glottal Closure Instants from Speech Signals: a Quantitative Review," IEEE Transactions on Audio, Speech, and Language Processing, vol. 20, Mar. 2012, pp. 994-1006.
George, D. et al., "Classification and unsupervised clustering of LIGO data with Deep Transfer Learning," Physical Review D, vol. 97, May 2018, 7 pages.
Kalafut, B. et al., "An objective, model-independent method for detection of non-uniform steps in noisy signals," Computer Physics Communications, vol. 179, Issue 10, Nov. 2008, pp. 716-723.
Mukherjee, S. et al., "Classification of glitch waveforms in gravitational wave detector characterization," Journal of Physics: Conference Series 243, 2010, IOP Publishing, 10 pages.
Sadler, B.M. et al., "Analysis of multiscale products for step detection and estimation," IEEE Transactions on Information Theory, vol. 45, Issue 3, Apr. 1999, IEEE, pp. 1043-1051.
Tyson, C. et al., "Automated nonparametric method for detection of step-like features in biological data sets," Cytometry Part A, vol. 87, No. 5, May 2015, first published Feb. 2015, 12 pages.
Yanci, A.G. et al., "Detecting Voltage Glitch Attacks on Secure Devices," 2008 Bio-inspired, Learning and Intelligent Systems for Security, Aug. 2008, Edinburgh, UK, IEEE, 6 pages.

\* cited by examiner

Algorithm 1: Glitch Metric Evaluation

Input: Time-series $\tau_x$, window length $w$
Output: Glitches present in $\tau_x$

---

// Transforming $\tau_x$ to $\tau_{\Delta_x^w}$

1 Interpolate $\tau_x$ with sampling frequency $f$
2 $f_x(t) \leftarrow$ `piece-wise-linear-approx`$(\tau_x)$
3 for $t' = t_1$ *to* $\max(time(\tau_x)) - w$ do
4 $\quad \mathcal{A}_x^w(t') = \int_{t'}^{t'+w} f_x(t)dt$
5 $\tau_{\Delta_x^w} = \{\}$
6 for $t_i = t_1$ *to* $\max(time(\tau_x)) - w$ do
7 $\quad \Delta_x^w(t_i) = \mathcal{A}_x^w(t_i) - \mathcal{A}_x^w(t_{i-1})$
8 $\quad \tau_{\Delta_x^w} \leftarrow \tau_{\Delta_x^w} + \{t_i, \Delta_x^w(t_i)\}$ // Collecting locations of spikes in $\tau_{\Delta_x^w}$ 9 $\sigma_{\tau_{\Delta_x^w}} \leftarrow$ Standard deviation of $\tau_{\Delta_x^w}$
10 $\mathcal{A}_{tol} \leftarrow 0.1 \cdot \sigma_{\tau_{\Delta_x^w}}$
11 $T_{spikes} = \{\}$
12 for $t_i = t_1$ *to* $max(time(\tau_{\Delta_x^w}))$ do
13 $\quad$ if $|\tau_{\Delta_x^w}(t_i)| > \mathcal{A}_{tol}$ then
14 $\quad\quad T_{spikes} \leftarrow T_{spikes} + \{t_i\}$ // Finding glitch locations 15 $G_O = G_U = \{\}$
16 for $t_i = min(T_{spike})$ *to* $max(T_{spike})$ do
17 $\quad$ if $t_{i+1} - t_i < w$ then
18 $\quad\quad$ if $\tau_{\Delta_x^w}(t_i) > \mathcal{A}_{tol}$ && $\tau_{\Delta_x^w}(t_{i+1}) < -\mathcal{A}_{tol}$ then
$\quad\quad\quad$ // overshoot detected
19 $\quad\quad\quad G_O \leftarrow G_O + \{t_i\}$
20 $\quad\quad$ if $\tau_{\Delta_x^w}(t_i) < -\mathcal{A}_{tol}$ && $\tau_{\Delta_x^w}(t_{i+1}) > \mathcal{A}_{tol}$ then
$\quad\quad\quad$ // undershoot detected
21 $\quad\quad\quad G_U \leftarrow G_U + \{t_i\}$ 22 return $G_O, G_U$

Algorithm 2: Level Detection Algorithm

Input: Time-series $\tau_x$, bin granularity $b$, level time $L_t$, interpolating frequency $f$

Output: Levels present in $\tau_x$

```
  // Interpolation
1 Interpolate τ_x with a sampling frequency f
  // Finding derivative
2 for i = 1 to len(τ_x) − 1 do
3    | τ'_x(t_i) ← (τ_x(t_{i+1}) − τ_x(t_i)) / (t_{i+1} − t_i)
  // Identifying levels
4 I ← [−0.1 · σ_{τ'_x} : 0.1 · σ_{τ'_x}]     // σ_{τ'_x} is the standard
     deviation of τ'_x
5 L = {}
6 for i = 0 to len(τ'_x) do
7    | levelDetected ← 1
8    | for t_j = t_i to t_i + L_t do
9    |    | if τ'_x(t_j) ∉ I then
10   |    |    | levelDetected ← 0
11   | if levelDetected = 1 then
12   |    | newLevel ← (1/L_t) Σ_{t=t_j}^{t_j+L_t} τ_x(t)
13   |    | L ← L + {newLevel}
14 return L
```

IDENTIFYING GLITCHES AND LEVELS IN MIXED-SIGNAL WAVEFORMS

RELATED APPLICATION

This application is a non-provisional conversion of and claims the benefit of U.S. Provisional Application Ser. No. 63/285,652, filed Dec. 3, 2021, the disclosure of which is hereby incorporated by reference in its entirety.

FIELD OF THE DISCLOSURE

The present disclosure relates to mixed-signal circuits and more particularly to identifying glitches and levels in analog and mixed-signal waveforms.

BACKGROUND

Levels (stable regions) and glitches (disturbances) in analog and mixed-signal (AMS) waveforms are important artefacts for verification and coverage analysis. Due to the non-idealities in such waveforms, it is difficult to mathematically express these artefacts and disambiguate them from noise, transitions, and transient regions.

Figure 1:
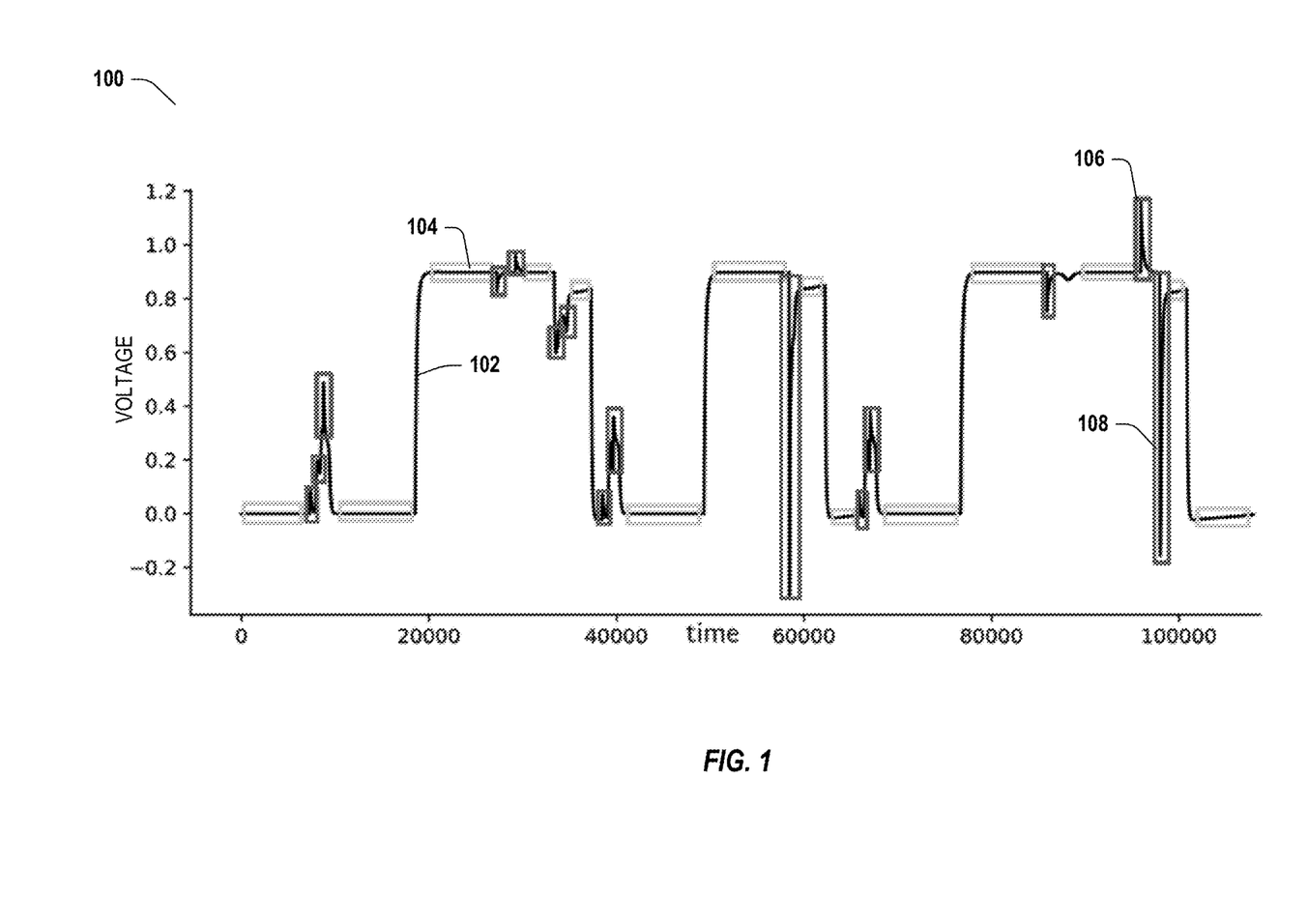
FIG. 1 is a graph depicting levels and glitches in a time domain response according to one or more embodiments of the present disclosure.

Automatic detection of levels (plateaus) and glitches in time domain signals is a fundamental requirement in AMS verification and coverage analysis. Levels represent stable regions, such as a settled voltage or current, and glitches represent momentary disturbances from a settled state, often regarded as an anomaly or undesired response. FIG. 1 shows a graph 100 containing a waveform 102 where a level 104 and glitches are shown with a first spike at 106 and a second spike at 108.

A challenge in automating the task of detecting levels and glitches is that these artefacts are functions of the resolution (time, voltage, etc.) at which the signal is examined. A level detected at high resolution may not be significant enough to be treated as a level at low resolution. Likewise, what appears as a glitch at low resolution may look like a transition between levels at high resolution. On the other hand, at higher resolutions, noise and glitches need disambiguation as they may look similar.

Figure 2:
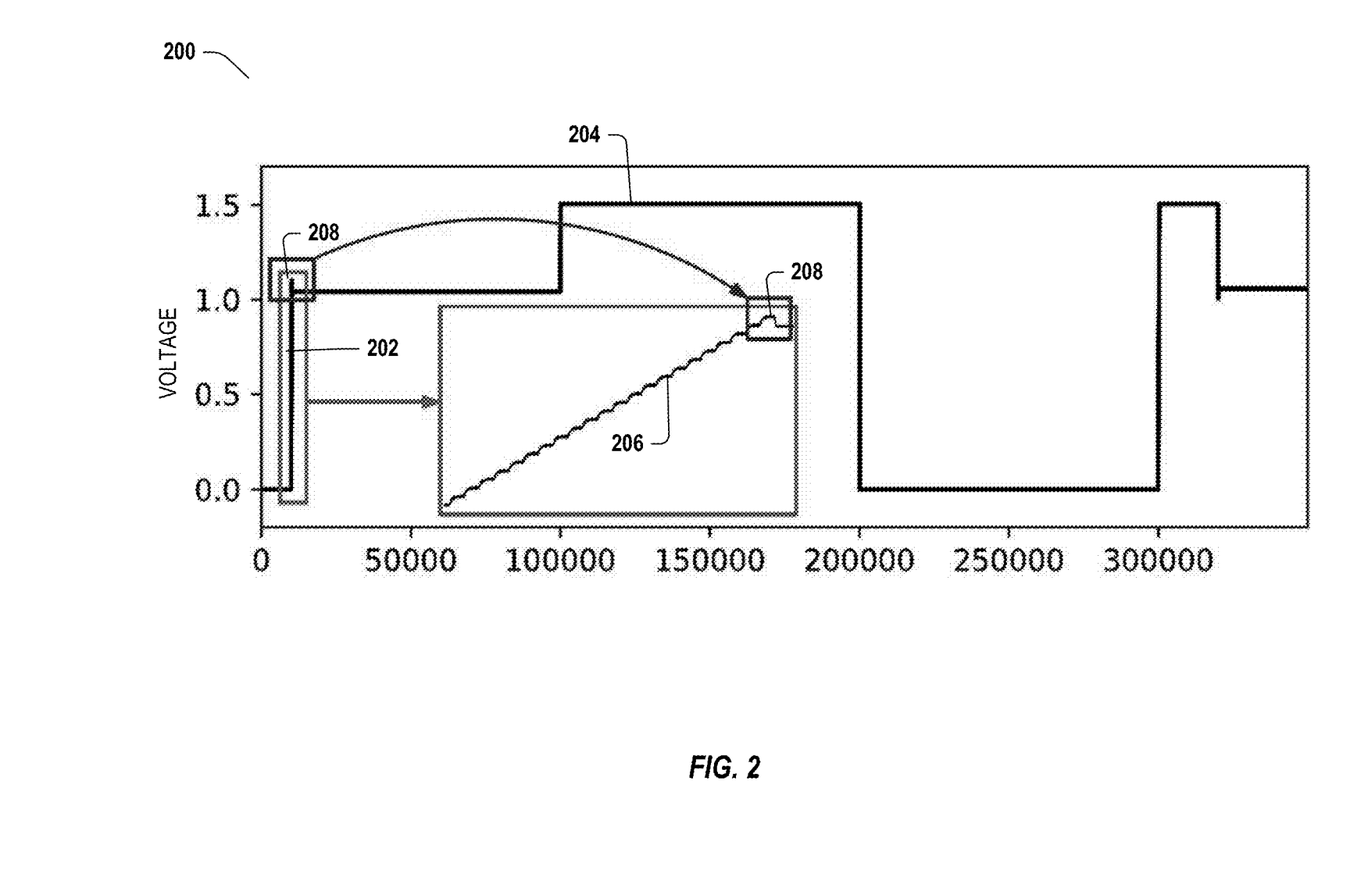
FIG. 2 is a graph depicting levels and glitches relative to resolution according to one or more embodiments of the present disclosure.

In a Low Dropout Voltage Regulator (LDO), which can be programmed to deliver power at two different set voltages, it would be desirable to detect which of these levels were reached in a simulation. Another important requirement is to detect whether, on high loads, the voltage level droops and settles into a (slightly) lower voltage level. Graph 200 in FIG. 2 illustrates a sample waveform 204 for the output voltage of an LDO programmed to operate at 1.0 V and 1.5 V.

Now consider the rise of the LDO voltage at 202 at the time of powering up. Sometimes LDOs are brought up using a digital calibration logic, which makes the voltage rise in small steps. By "zooming into," or showing with higher resolution, the rise time response of the LDO, these levels 206 can be seen. A designer concerned with calibrating the rise time of the LDO will be interested in detecting these levels and determining whether it may be possible to shorten the rise time by reducing the dwell time in these transient intermediate levels. When the signal for the entire response of the LDO is considered, it may be desirable to ignore these levels.

When the signal is restricted to the rise time response only, detecting these levels may be desirable. Likewise, 208 in FIG. 2 shows that there is a level overshoot i.e., one additional level reached during the calibration that looks like a glitch in low resolution.

SUMMARY

Various embodiments disclosed herein provide for a glitch detection and level detection method that uses information contained in the signal itself to determine at which resolution or granularity the glitch detection and level detection operates. In particular, the glitch detection method comprises defining a glitch in terms of a change in the area under the waveform which can serve to disambiguate glitches from noises and other transient side effects of level transitions. Likewise, the level detection method uses an entropy-based metric to identify levels that are significant in context of the entire signal and not in absolute terms.

In an embodiment, a method to detect a glitch in a signal can include uniformly sampling the signal to abstract it as a time-series comprising real values. The method can also include determining a sequence of rates of change in area under the signal in sequential time periods, wherein the time periods comprise a plurality of time points. The method can also include determining that a glitch in the signal has occurred in response to determining that among adjacent time periods the a first absolute value of a rate of change of area between the first and second time periods is above a rate of change threshold, a second absolute value of a rate of change of area between the second and third time periods is above the rate of change threshold, and a third absolute value of a rate of change of area between first and third time periods is below the rate of change threshold. The method can also include performing a signal processing operation based on determining that the glitch in the signal has occurred.

In an embodiment, a method to detect a level in a signal can include uniformly sampling the signal to abstract it as a time-series consisting of real values. The method can also include determining a width of a time period to detect the levels in the signal, based on a function of entropy associated with the signal, wherein the level indicates that a value of a characteristic of the signal does not change beyond a specified range during the time period. The method can also include determining that a level has occurred in response to values of characteristics of the signal remaining within a value range for time points associated with the time period. The method can also include performing a signal processing operation based on determining that the level in the signal has occurred.

In an embodiment, a signal processing device can include a memory that stores computer-executable instructions and a processor that executes the computer executable instructions to perform operations. The operations can include uniformly sampling the signal to abstract it as a time-series comprising real values. The operations can include determining a sequence of rates of change in area under the signal in sequential time periods, wherein the time periods comprise a plurality of time points. The operations can include determining that a glitch in the signal has occurred in response to determining that among adjacent time periods the a first absolute value of a rate of change of area between the first and second time periods is above a rate of change threshold, a second absolute value of a rate of change of area between the second and third time periods is above the rate of change threshold, and a third absolute value of a rate of change of area between first and third time periods is below the rate of change threshold. The operations can include determining a width of a time period to detect the levels in the signal, based on a function of entropy associated with the signal, wherein the level indicates that a value of a characteristic of the signal does not change beyond a specified range during the time period. The operations can include determining that a level has occurred in response to values of characteristics of the signal remaining within a value range for time points associated with the time period.

Those skilled in the art will appreciate the scope of the present disclosure and realize additional aspects thereof after reading the following detailed description of the preferred embodiments in association with the accompanying drawing figures. The scope can be expanded beyond just time response waveforms, to also include frequency response waveforms and other transform domain waveforms. In such cases the time points, time series and time window can be frequency points, frequency series and frequency window (or bandwidth), or other such equivalent measures as appropriate to the quantity represented in x-axis i.e., quantity against which a response of signal or its function is measured or analyzed. Further, the signal may represent magnitude and/or phase of a characteristic (voltage, current, power, energy or impedance), when the signal itself is complex valued.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Various embodiments disclosed herein provide for a glitch detection and level detection method that use information contained in the signal itself to determine at which resolution or granularity the glitch detection and level detection operates. In particular, the glitch detection method comprises defining a glitch in terms of a change in the area under the waveform which can serve to disambiguate glitches from noises and other transient side effects of level transmissions. Likewise, the level detection method uses an entropy-based metric to identify levels that are significant in context of the entire signal and not in absolute terms.

Asking the designer for the resolution (or granularity) as a prerequisite for detecting levels and glitches is not a preferred option, since there is no known scientific basis for making such a choice and, therefore, the choice is largely subjective, and sometimes based on prior experience. In the present disclosure, the information present in the signal is used to automatically make the choice of resolution and/or granularity to use when detecting glitches or levels.

In an embodiment of the present disclosure, a novel metric is disclosed for defining glitches in terms of local changes in the area under the waveform. This approach serves to disambiguate glitches from noises and transient side effects of level transitions.

In an embodiment of the present disclosure, another novel entropy-based metric is disclosed for detecting levels in a waveform of a signal. The entropy-based metric enables the detection of levels that are significant in the context of the entire signal and not in absolute terms.

Definition 1 [Time-series of a signal]: Time-series of a signal x is a mapping $\tau_x: T \to X$, where $T=\{t_1, t_2, \ldots, t_n\}$, ($t_i \in \mathbb{R}_{\geq 0}$, $\forall i \in [1, n]$) and $X \in \mathbb{R}$. The value of x at a time point $t \in T$ in the time-series $\tau_x$ is given as $\tau_x(t)$.

To denote the set of value points val $(\tau_x)=\{\tau_x(t_1), \tau_x(t_2), \ldots, \tau_x(t_n)\}$ is used. To denote the time points in the series, time$(\tau_x)=\{t_1, \ldots, t_n\}$ is used. Then $t_1=\min(\text{time}(\tau_x))$ and $t_n=\max(\text{time}(\tau_x))$ respectively denote the first and last time points in time $(\tau_x)$. $n=\text{len}(\tau_x)$ is used to denote the number of data points present in $\tau_x$.

Definition 2 [Local Area under a signal]: For a time-series $\tau_x$ and a window of length w, the area under the signal in the window extending from t' to t'+w is given as follows:

$$\mathcal{A}_x^w(t')=\int_{t'}^{t'+w} f_x(t)dt \qquad \text{Eqn. 1}$$

where $f_x(t)$ is the piece-wise-linear approximation of $\tau_x$.

The value domain of a signal, x, is partitioned into bins, using a parameter called bin granularity. In the most generic case, this represents the accuracy of the simulator, but end users including verification engineers and test engineers may choose coarser bins for specific tasks. For example, for coverage analysis of the output voltage levels of an LDO, the bin granularity may be coarser than for the task of looking for power droops around a specific voltage level.

Definition 3 [Entropy of Signal]: For a time-series $\tau_x$, a given bin granularity b, and $a=\min(\text{val}(\tau_x))$, entropy of the signal is defined as follows:

$$S(\tau_x, b) = -\sum_i P_i \cdot \log P_i \text{ where} \qquad \text{Eqn. 2}$$

$$P_i = \frac{|\{t_j \mid a+b \cdot i \leq \tau_x(t_j) < a+b \cdot (i+1)\}|}{\text{len}(\tau_x)} \qquad \text{Eqn. 3}$$

Intuitively, $P_i$, represents the fraction of the time points at which the signal finds itself in the $i^{th}$ bin.

Glitch Detection Metric

Local changes in the area under the curve as used as a feature to define glitches. Let $\mathcal{A}_x^w(t)$ denote the area under the curve for a given small window of length w extending from time t onward (Definition 2). The area under the curve for such windows changes momentarily and sharply when a glitch is experienced. The local change in area, $\Delta_x^w(t_i)$, at time-point $t_i$ is defined as follows.

$$\Delta_x^w(t_i)=\mathcal{A}_x^w(t_i)-\mathcal{A}_x^w(t_{i-1}) \qquad \text{Eqn. 4}$$

Figure 3:
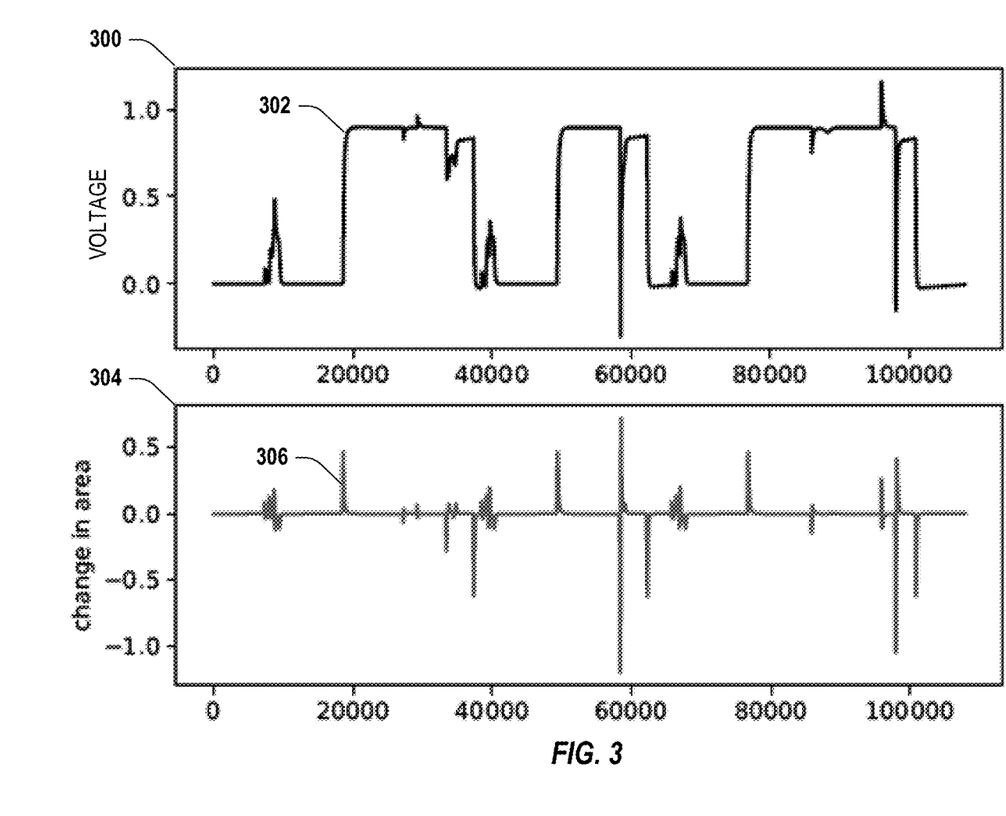
FIG. 3 is a graph depicting glitches and local change in area according to one or more embodiments of the present disclosure.

Corresponding to the time-series, $\tau_x$, FIG. 3 shows the plot, $\tau_{\Delta_x^w}$, of the local change in area, $\Delta_x^w(t)$ over time. For every increase 302 in some measured parameter of the signal in graph 300, there is a spike 306 showing an increase in the local change in area in graph 304. A corresponding decrease in the measured value of the characteristic of the signal in 300 would result in a downward spike in local change in area in graph 304.

Theorem 1: Glitches of width larger than w in a time-series $\tau_x$, appear as bi-directional spikes in $\Delta_x^w(t)$.

Proof: Let [$t_1: t_2$] denote the tight interval in a time-series, $\tau_x$, containing a glitch, that is, the width of the glitch is ($t_2-t_1$). A window w is $w \leq (t_2-t_1)$. When a window is capturing the glitch (an overshoot), the area under it is more than when it is not. If the local change in area is considered, $\Delta_x^w(t)$, on both ends of the interval [$t_1:t_2$], then $\Delta_x^w(t_1)>0$ and $\Delta_x^w(t_2)<0$. Between $t_1$ and $t_2$, the value of $\Delta_x^w(t)$ rises sharply and then switches sign abruptly as the peak is crossed. This causes the bi-directional spike. A similar argument will hold for an undershoot where $\Delta_x^w(t)$ falls sharply and then rises.

If the signal is steady at some level at time t, then $\Delta_x^w(t) \approx 0$. If the signal transitions from one steady level to a higher level at time t, then $\Delta_x^w(t)$ increases sharply and then decreases sharply, but does not become negative. If the signal transitions from a steady level to a lower level at time t, then $\Delta_x^w(t)$ decreases sharply and then increases sharply, but does not become negative. Therefore, a level transition shows up as a uni-directional spike. The uni-directional spike compensates for the overshoot (or undershoot) accompanying a level transition and helps to disambiguate these transients from glitches.

In order to disambiguate glitches from noise, it is helpful that the local change in area, $\Delta_x^w(t)$, is substantial. Therefore, a threshold parameter, $\mathcal{A}_{tol}$ is used. Based on Theorem 1 and the above understanding, the metric for detecting glitches is formalized as follows.

Definition 4 [Glitch]: A glitch in a time-series is defined with respect to parameters, window length w, and tolerance, $\mathcal{A}_{tol}$, as follows. For three successive placements of the left boundary of the window at t', t'+w, and t'+2w a glitch is said to be detected in the time interval [t'+w:t'+2w] if the following conditions hold.

$$|\mathcal{A}_x^w(t')-\mathcal{A}_x^w(t'+w)| \geq \mathcal{A}_{tol}$$

$$|\mathcal{A}_x^w(t'+w)-\mathcal{A}_x^w(t'+2w)| \geq \mathcal{A}_{tol}$$

$$|\mathcal{A}_x^w(t')-\mathcal{A}_x^w(t'+2w)| < \mathcal{A}_{tol}$$

Figure 4:
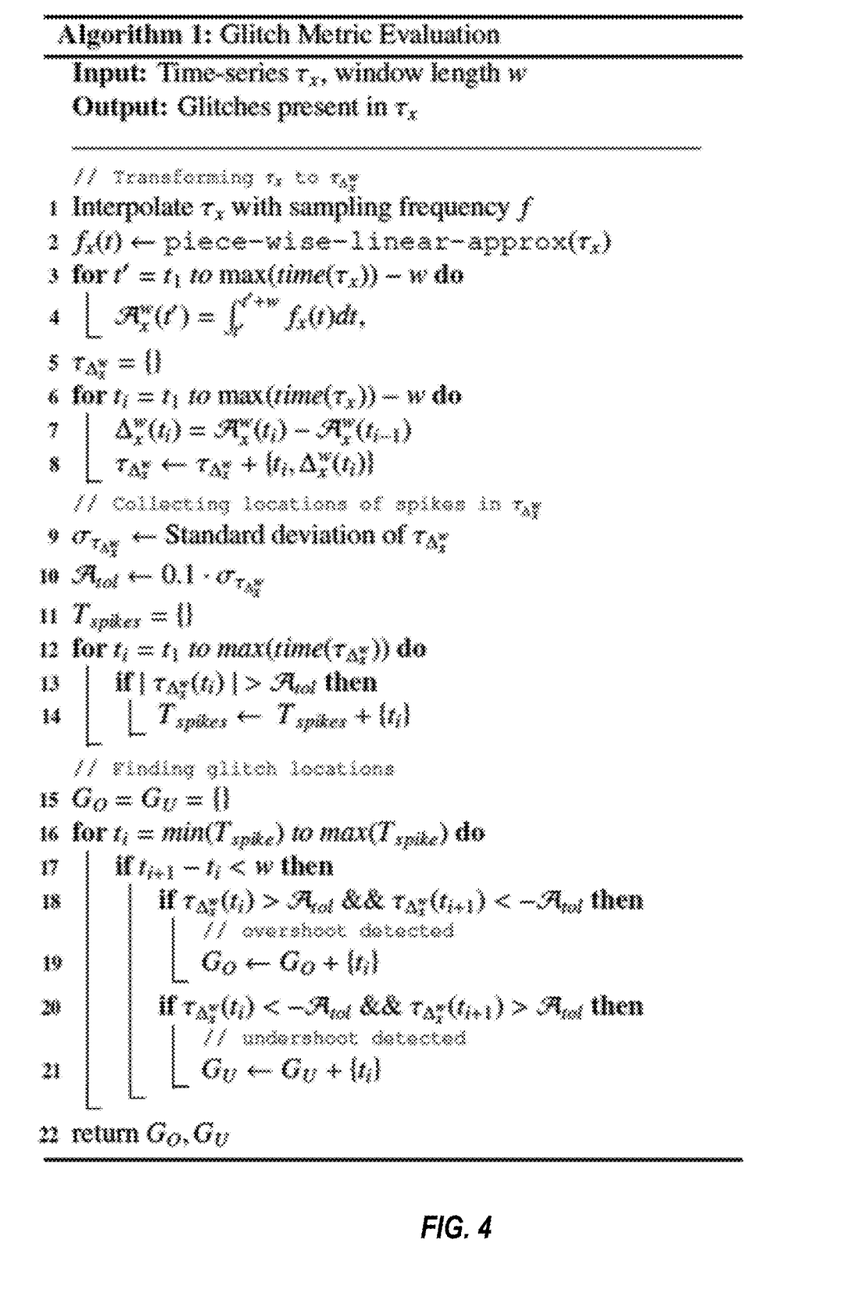
FIG. 4 is a glitch evaluation algorithm according to one or more embodiments of the present disclosure.

Pseudo-code of Algorithm 1 in FIG. 4 outlines the evaluation of the glitch metric on a time-series. According to an embodiment, $\tau_x$. $\tau_x$ is uniformly sampled. If a waveform does not meet this criterion, then interpolation can be used to prepare a uniformly sampled time-series before using this algorithm.

Theorem 2: Algorithm 1 correctly finds glitches that satisfy Definition 4.

Proof: Algorithm 1 has three parts. In lines 1-8 it creates the time-series, $\tau_{\Delta_x^w}$, from $\tau_x$. It first prepares the time-series, $\tau_x$ to a uniformly sampled time-series having sampling frequency, f. In Lines 2-4 it computes the area under the signal, and in Lines 6-8 it finds the local change in area under the signal at each sample and adds them into the time-series, $\tau_{\Delta_x^w}$.

In the second part (Lines 9-14), the algorithm identifies the spikes, namely those time points where the local area under the signal exceeds the tolerance, $\mathcal{A}_{tol}$. The sequence of spikes defines the time-series, $T_{spike}$.

In the third part (Lines 15-21), the algorithm finds successive spikes of opposite direction within a window w and reports such locations as glitches. Theorem 1 tells us that every glitch in $\tau_x$ will produce successive spikes of opposite direction, and is therefore detected by Algorithm 1. Conversely, successive glitches in the same direction, and successive glitches that are separated by more than w are not reported as glitches by Algorithm 1 since these represent successive level transitions.

FIG. 1 shows an example of the time-series, $\tau_x$, and the time-series, $T_{spike}$. The uni-directional spikes are present at the time points of level transitions and the bi-directional spikes at the glitches 106 and 108.

Level Detection Metric

The present disclosure presents a proposed metric for defining and evaluating levels or plateaus in a signal.

Definition 5 [Level]: A level in a signal is the discrete value attained during the time interval where the discrete differentiation of the signal stays close to zero for a considerable period of time. With a declared level time, $L_t$, $l_i$ is called a level of signal f(t) if and only if at $\exists \hat{t} \in \mathbb{R}^+$ such that:

$$\forall t' \in [\hat{t}:\hat{t}+L_t], f'(t') \in [-L_{tol}:L_{tol}], l_i = \mu[f(t')]$$ Eqn. 5 where $\mu$ represents the mean. Definition 5 relies on two parameters, namely:
1) Bin granularity: The bin granularity b specifies the resolution at which distinct levels are identified.
2) Level time: A level is said to be reached when the signal reaches the corresponding bin and remains there for a minimum period of time defined by level time parameter, $L_t$.

In Definition 5, the level time parameter has been used explicitly, and the parameter $L_{tol}$ is derived from bin granularity.

The choice of the level time parameter is relevant to the detection of levels. Larger values of $L_t$ misses levels with small dwell times such as the steps 206 shown in FIG. 2. Smaller values of $L_t$ misrepresents transients as levels. Since the end user's (including verification engineer's and test engineer's) interest in detecting levels is relative to the part of the waveform that is being focused on, a methodology is disclosed herein for choosing level time based on the information contained in the part of the waveform under consideration. The following notations and definitions are used.

$\tau_x$: Time-series for x, uniformly sampled at $t_1, \ldots, t_n$
$\tau_{x'}$: Time-series obtained by normalizing the value domain of $\tau_x$ to [0:1]
$E_{\tau_{x'}}[t_i, t_j]$: Entropy of time-series $\tau_{x'}$ in the interval, $[t_i, t_j]$, following Definition 3
$S_x = E_{\tau_{x'}}[t_1, t_n]$: Entropy of $\tau_x$!
$s_{\tau_{x'}}^w$: Time-series consisting of $s_{\tau_{x'}}^w(t_i) = E_{\tau_{x'}}[t_i, t_{i+w}]$
$S'_{x,w}$: Entropy of time-series $s_{\tau_{x'}}^w$ In the above, $s_{\tau_{x'}}^w$ is a time-series consisting of the entropy of the normalized signal, $\tau_{x'}$, computed over windows of width w samples. $S'_{x,w}$ is the entropy of this time-series, where as $S_x$ is the entropy of the original normalized signal, $\tau_{x'}$. $S_x$ can be the primary entropy of $\tau_x$, and $S'_{x,w}$ can be considered the secondary entropy of $\tau_x$ with respect to window size, w.

Theorem 3: Let $\tau_x$ be a time-series, uniformly sampled at $t_1, \ldots, t_n$. Then the secondary entropy, $S'_{x,w}$, is zero when w=0 and when w=n-1

Proof: The choice w=0 represents the case where there is only one time point in each window, and therefore a single value. By Definition 3, the entropy will be zero in all windows. Thereby the secondary entropy, $S'_{x,w}$, will be zero.

The choice w=n-1 represents the case where all time points are covered in a single window. In this case, $s_{\tau_{x'}}^w$, will contain a single point having the value $S_x$. Consequently, the secondary entropy will be zero.

The time-series, $s_{\tau_{x'}}^w$, captures the variations in the primary entropy over time, when computed over windows of width w. Theorem 3 shows that for extreme choices of w, the secondary entropy becomes zero. The following definition is thus used for choosing the level time parameter, $L_t$.

Definition 6 [Level Time]: The level time, $L_t$, for a time-series, $\tau_x$, is the value w for which $|S_x - S'_{x,w}|$ is minimum, namely the difference between secondary entropy and primary entropy is the least, or when the secondary entropy is closest to the primary entropy.

Definition 6 provides a heuristic choice of $L_t$. In order to prove that this choice helps in identifying the levels correctly, the notion of a level in a signal is defined independent of a level time (or similar) parameter, thereby returning to the problem of defining levels with respect to the signal itself.

On the other hand, the choice of $L_t$ following Definition 6 works very well in practice. The intuitive justification for this is as follows. The primary entropy varies with the fraction of time points spent in different bins. If a signal is steady over long periods of time, then the corresponding levels dominate the primary entropy. In the time-series, $\tau_x$, the total dwell time at a level may be fragmented and spread across the timeline. Thus $s_{\tau_{x'}}^w$ is computed for this reason.

Choosing a value of w which is smaller than the fragments causes the entropy to be zero at the many windows where the signal does not change from one bin to another. These windows have zero entropy, that is, $s_{\tau_{x'}}^w(t)=0$. The windows overlapping with the transients have non-zero entropy, but due to the choice of small w, such windows are few and therefore have limited effect on the secondary entropy. Hence $S'_{x,w} < S_x$ for small values of w.

As the value of w increases, more windows have overlap with the transients, resulting in increase in the secondary entropy. On the other hand, if w becomes too large, then all windows have high entropy and the variations in the entropy between windows goes down. This, too, reduces the secondary entropy, and thereby $S'_{x,w} < S_x$ is true for very large values of w.

A value of w such that $S'_{x,w}$ and $S_x$ are close yields windows that retains the levels with significant dwell time and eliminates the small steps detected by a small choice of w.

Figure 6:
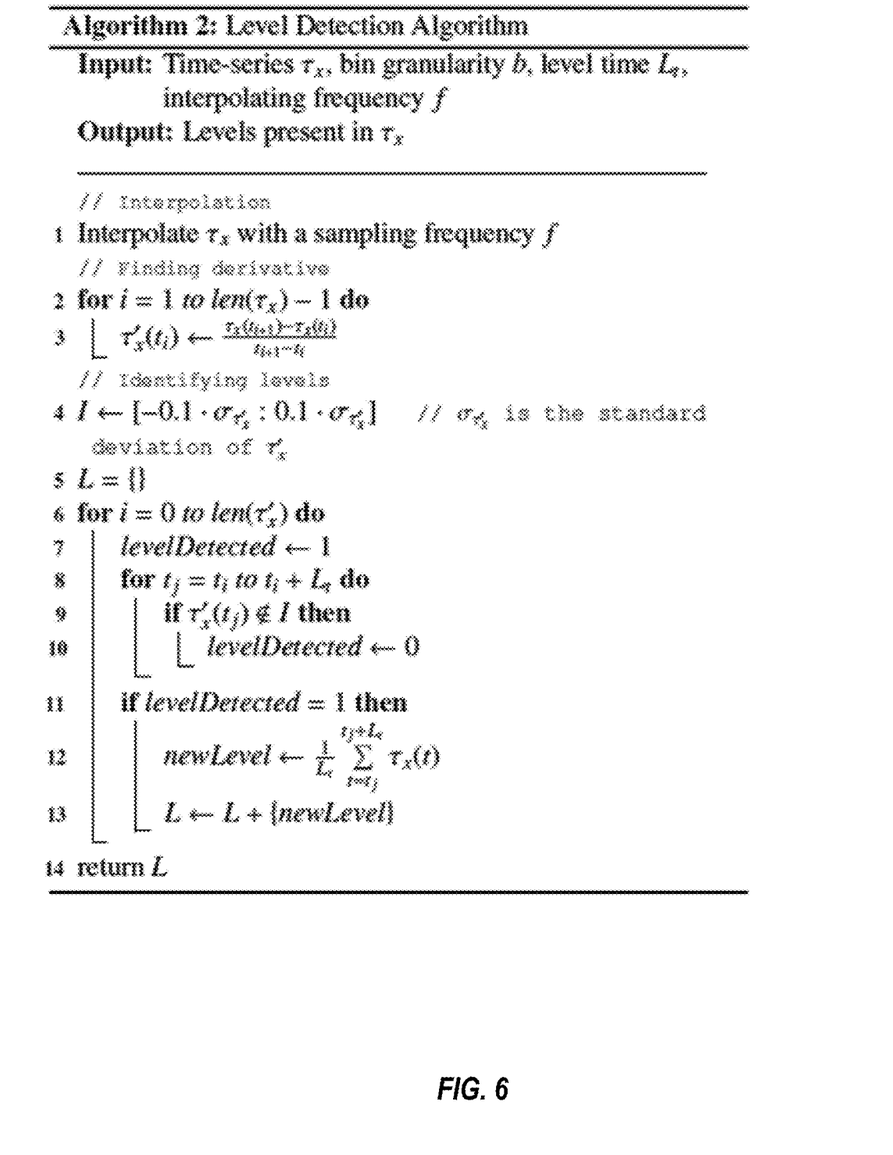
FIG. 6 is a level detection algorithm according to one or more embodiments of the present disclosure.

Algorithm 2 in FIG. 6 performs level detection using the chosen value of the parameter, $L_t$. The main steps in level identification are as follows.

Figure 5:
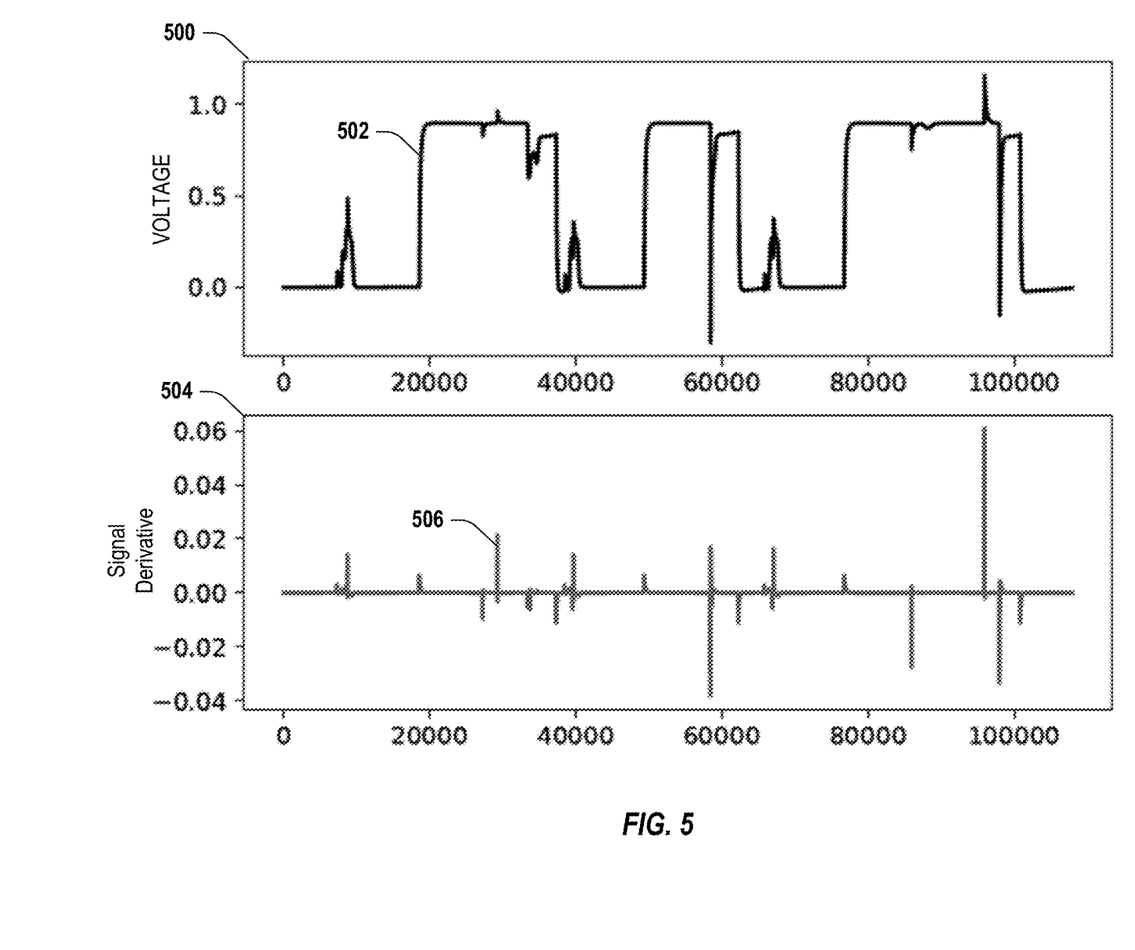
FIG. 5 is a graph depicting discrete differentiation according to one or more embodiments of the present disclosure.

The discrete derivative, $\tau'_x$ of the signal is computed. As shown in FIG. 5, the graph 504 depicting $\tau'_x$ 506 is a good representation of the locations of the levels in the signal 502 in graph 500.

Once a continuous window of length $L_t$ is found, where values in $\tau'_x$ does not deviate from the set boundaries of I, that time portion is said to belong to a level in the original signal. The mean value of the signal in such a window is said to be the level value corresponding to this window of time.

The proposed metrics and algorithms were validated on different types of waveforms gleaned from the power delivery circuit of an industrial AMS design. The glitch and level detection algorithms were executed on an Intel Core™ i7-8700 CPU @ 3.20 GHz with 16 GB RAM. Two types of cases were considered.

Type-I: The waveforms sets were manually tagged by experienced designers to indicate the glitches and levels based on their understanding.

Type-II: Waveforms for which no information was provided by the designers.

For Type-I waveforms, it was shown that the levels and glitches detected by the automated methodology disclosed herein matched with the tagged ones. For Type-II waveforms, the disclosed algorithms found glitches and levels that were validated by designers in normal resolution (that is, taking the whole waveform at a time). For Type-II waveforms, the techniques disclosed herein also pointed out levels and glitches that could be seen when the metric was applied after zooming into specific parts of the waveform. Since these are not visible when the whole waveform is visually inspected at normal resolution, the findings surprised the designers in some cases, leading to debugging and early isolation of defects.

The time points where the glitches occur were shown as coloured dots on a graphical display—blue for overshoots and red for undershoots. Interestingly, designers did not notice any glitches in some of the results, but the algorithm determined otherwise. On diagnosis of the zoomed-in portions of the signals, the analog design engineers confirmed that the glitches were indeed present and revealed abnormalities. For level detection, the entropy-based metric for choosing the level time parameter enabled in automatically choosing a suitable resolution based on the part of the waveform being considered. In one example, the level time parameter was automatically chosen to be large enough to reveal only the voltages at which the Low Dropout Regulator (LDO) output settled. On the other hand, when the algorithm was presented only the time window during which the LDO rises at the beginning, it revealed an increasing sequence of voltage steps.

Figure 7:
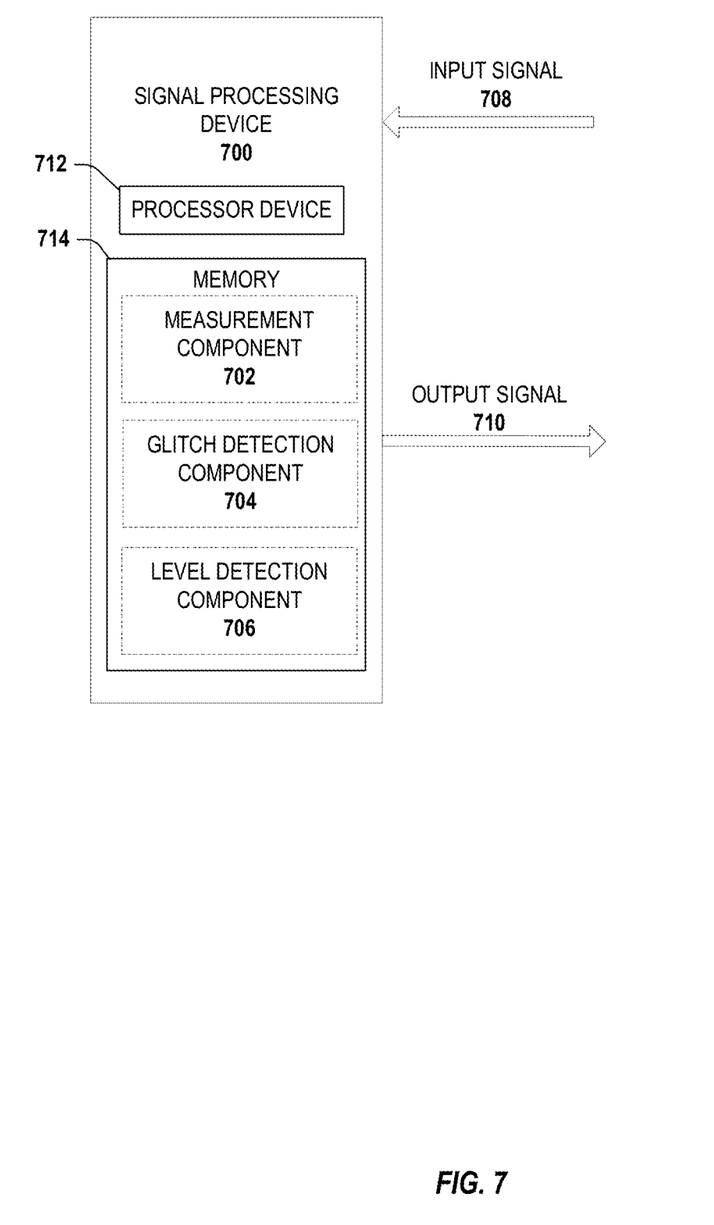
FIG. 7 is a diagram of signal processing device that can perform glitch detection and level detection according to one or more embodiments of the present disclosure.

FIG. 7 illustrates a signal processing device 700 that can perform glitch detection and level detection according to one or more aspects of the present disclosure.

The signal processing device 700 can include a processor device 712 and a memory 714. The memory 714 can store computer executable instructions or components that can be executed by the processor 712 to perform various operations. For example, the measurement component 702 can measure various values of characteristics such as the voltage or the current of an incoming signal 708 at each time point of a series of time points.

The glitch detection component 704 can determine a sequence of rates of changes of values of the characteristic of the signal in sequential time periods, wherein the time periods comprise one or more time points and determine that a glitch in the signal has occurred in response to determining that a first absolute value of a rate of change of a first time period is above a rate of change threshold, a second absolute value of a rate of change of a second time period immediately following the first time period is above the rate of change threshold, and a third absolute value of a rate of change of a third time period is below the rate of change threshold, wherein the third time period comprises the first time period and the second time period.

The level detection component 706 can determine a time period in which to detect a level in the signal, based on a function of entropy associated with the signal, wherein the level indicates that the value of the characteristic of the signal does not change during the time period and determine that a level has occurred in response to the values of the characteristic of the signal remaining within a value range for time points associated with the time period.

After the glitch or level has been identified, the signal processing device 700 can perform one or more signal processing operations on the incoming signal 708 to generate an outgoing signal 710.

Figure 8:
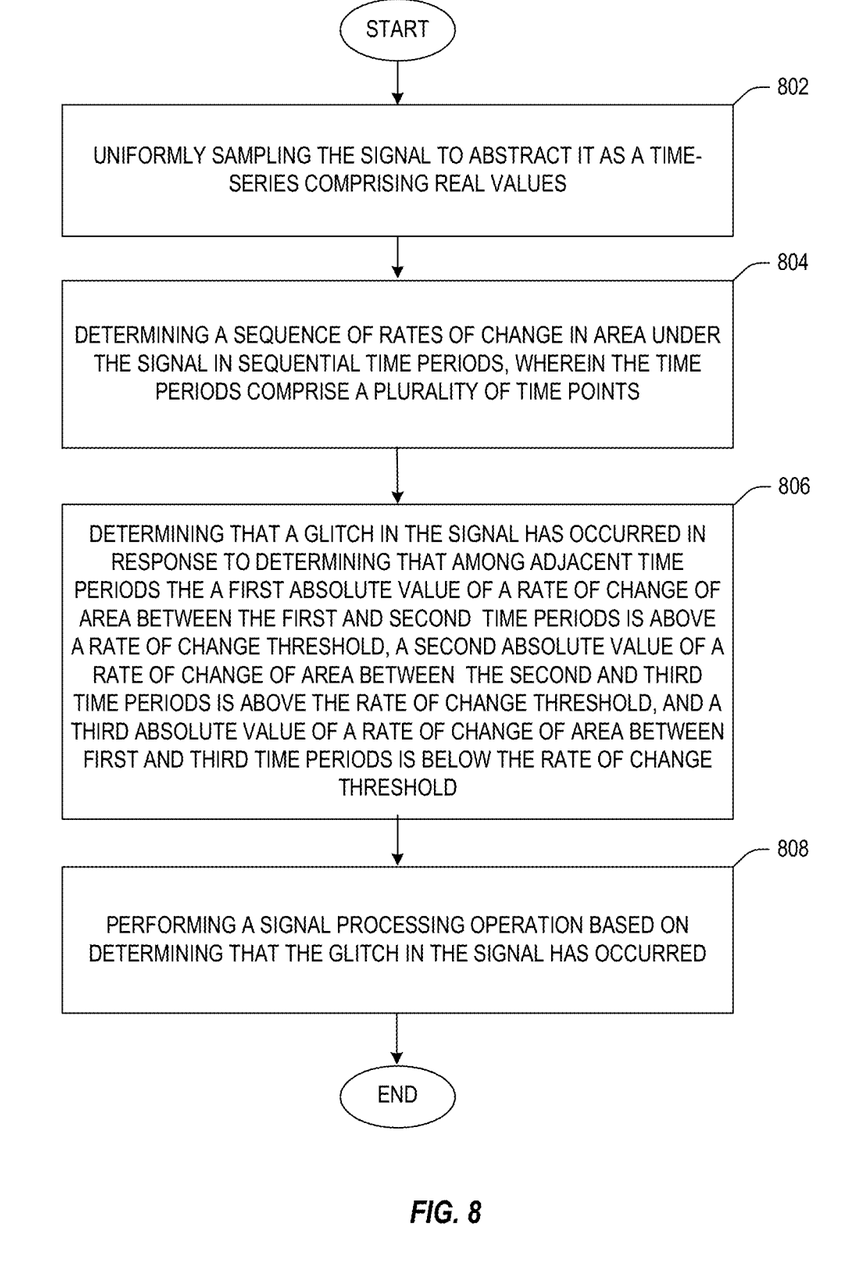
FIG. 8 is a flowchart of a method for glitch detection according to one or more embodiments of the present disclosure.

FIG. 8 illustrates a method for glitch detection according to one or more embodiments of the present disclosure.

At step 802, the method includes uniformly sampling the signal to abstract it as a time-series comprising real values.

At step 804, the method includes determining a sequence of rates of change in area under the signal in sequential time periods, wherein the time periods comprise a plurality of time points.

At step 806, the method includes determining that a glitch in the signal has occurred in response to determining that among adjacent time periods the a first absolute value of a rate of change of area between the first and second time periods is above a rate of change threshold, a second absolute value of a rate of change of area between the second and third time periods is above the rate of change threshold, and a third absolute value of a rate of change of area between first and third time periods is below the rate of change threshold.

At step 808, the method includes performing a signal processing operation based on determining that the glitch in the signal has occurred.

Figure 9:
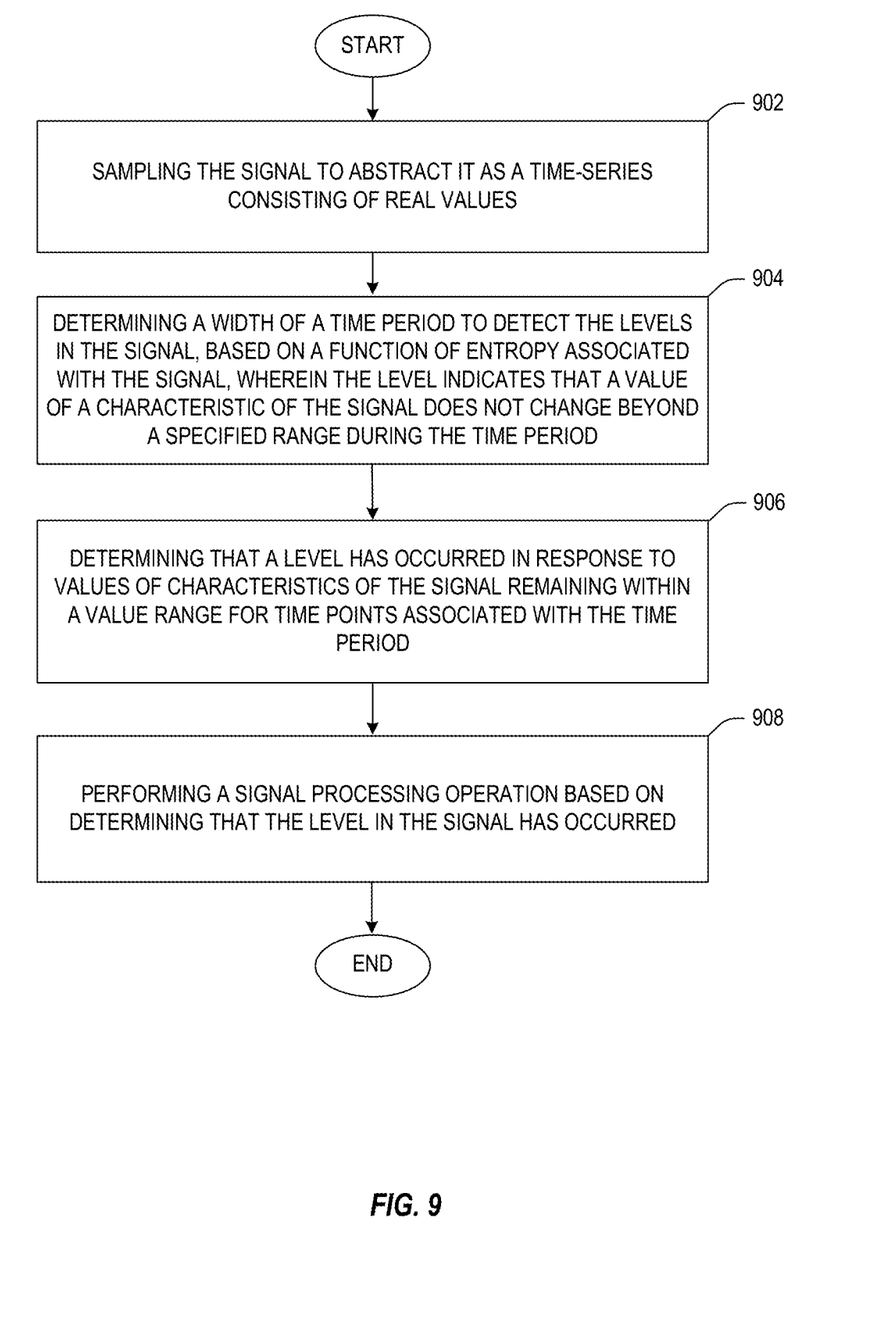
FIG. 9 is a flowchart of a method for level detection according to one or more embodiments of the present disclosure.

FIG. 9 illustrates a method for level detection according to one or more embodiments of the present disclosure.

At step 902, the method includes sampling the signal to abstract it as a time-series consisting of real values.

At step 904, the method includes determining a width of a time period to detect the levels in the signal, based on a function of entropy associated with the signal, wherein the level indicates that a value of a characteristic of the signal does not change beyond a specified range during the time period.

At step 906, the method includes determining that a level has occurred in response to values of characteristics of the signal remaining within a value range for time points associated with the time period.

At step 908, the method includes performing a signal processing operation based on determining that the level in the signal has occurred.

Those skilled in the art will recognize improvements and modifications to the preferred embodiments of the present disclosure. All such improvements and modifications are considered within the scope of the concepts disclosed herein and the claims that follow.

What is claimed is:

1. A method to detect a glitch in a signal, comprising:
receiving the signal comprising an analog or mixed-signal waveform;
uniformly sampling the signal to abstract it as a time-series comprising real values;
determining a sequence of rates of change in area under the signal in sequential time periods, wherein the time periods comprise a plurality of time points;
determining that a glitch in the signal has occurred in response to determining that among adjacent time periods the a first absolute value of a rate of change of area between the first and second time periods is above a rate of change threshold, a second absolute value of a rate of change of area between the second and third time periods is above the rate of change threshold, and a third absolute value of a rate of change of area between first and third time periods is below the rate of change threshold; and performing a signal processing operation based on determining that the glitch in the signal has occurred, wherein the signal processing operation comprises displaying a graphical representation of the waveform and graphically identifying the glitch.

2. The method of claim 1, wherein the sequence of rates of changes of the values of the characteristic of the signal is based on a function of the values of the characteristic of the signal over the time period.

3. The method of claim 2, wherein the function represents an area under the analog or mixed-signal waveform associated with the signal.

4. The method of claim 1, wherein the characteristic of the signal is at least one of voltage, current, power, energy, or impedance or some function thereof.

5. The method of claim 1, wherein a sum of a first rate of change of the first time period and a second rate of change of the second time period is below the rate of change threshold.

6. The method of claim 5, wherein the first rate of change of the first time period is in an opposite direction to the second rate of change of the second time period.

7. The method of claim 1, wherein the signal is uniformly sampled.

8. A method to detect a steady-state levels in a signal, comprising:

receiving the signal comprising an analog or mixed-signal waveform;

sampling the signal to abstract it as a time-series consisting of real values;

determining a width of a time period to detect the levels in the signal, based on a function of entropy associated with the signal, wherein the level indicates that a value of a characteristic of the signal does not change beyond a specified range during the time period;

determining that a level has occurred in response to values of characteristics of the signal remaining within a value range for time points associated with the time period; and performing a signal processing operation based on determining that the level in the signal has occurred, wherein the signal processing operation comprises displaying a graphical representation of the waveform at a resolution determined based on the analog or mixed signal waveform and graphically identifying the level.

9. The method of claim 8, further comprising:
determining a value of level-time based on the granularity at which signal is viewed.

10. The method of claim 8, wherein the entropy associated with the signal comprises a first entropy associated with the series of time points and a second entropy associated with a subset of the series of time points.

11. The method of claim 10, wherein the determining the time period further comprises identifying the value of the time period that results in a lowest difference between the second entropy and the first entropy.

12. The method of claim 10, wherein the first entropy is computed based on a distribution of percentage of time points of the time-series across the value range of the time-series.

13. The method of claim 8, wherein the signal is uniformly sampled.

14. The method of claim 10, wherein the second entropy is based on a distribution of percentage of time points of a derived time-series across the value range of the derived time-series where, the derived time-series is obtained by computing the entropies in sequential time periods of the original time-series.

15. The method of claim 8, wherein the characteristic of the signal is at least one of voltage, current, power, energy, impedance, or some function thereof.

16. A signal processing device, comprising:
a memory that stores computer-executable instructions
a processor that executes the computer-executable instructions to perform operations, comprising:

receive the signal comprising an analog or mixed-signal waveform;

uniformly sample the signal to abstract it as a time-series comprising real values;

determine a sequence of rates of change in area under the signal in sequential time periods, wherein the time periods comprise a plurality of time points;

determine that a glitch in the signal has occurred in response to determining that among adjacent time periods the a first absolute value of a rate of change of area between the first and second time periods is above a rate of change threshold, a second absolute value of a rate of change of area between the second and third time periods is above the rate of change threshold, and a third absolute value of a rate of change of area between first and third time periods is below the rate of change threshold;

determine a width of a time period to detect the levels in the signal, based on a function of entropy associated with the signal, wherein the level indicates that a value of a characteristic of the signal does not change beyond a specified range during the time period;

determine that a level has occurred in response to values of characteristics of the signal remaining within a value range for time points associated with the time period; and display a graphical representation of the waveform at a resolution determined based on the analog or mixed signal waveform and graphically identifying the glitch and the level.

17. The signal processing device of claim 16, wherein the characteristic of the signal is at least one of voltage, current, power, energy, or impedance or some function thereof.

18. The signal processing device of claim 16, wherein the sequence of rates of changes of the values of the characteristic of the signal is based on a function of the values of the characteristic of the signal over the time period.

19. The signal processing device of claim 16, wherein the function represents an area under the analog or mixed-signal waveform associated with the signal.

20. The signal processing device of claim 16, wherein the entropy associated with the signal comprises a first entropy associated with the series of time points and a second entropy associated with a subset of the series of time points.

21. The signal processing device of claim 20, wherein the determining the time period further comprises identifying the value of the time period that results in a lowest difference between the second entropy and the first entropy.

22. The signal processing device of claim 20, wherein the first entropy is computed based on a distribution of percentage of time points of the time-series across the value range of the time-series, and wherein the second entropy is based on a distribution of percentage of time points of a derived time-series across the value range of the derived time-series where.

* * * * *